March 13, 1962 W. GREATBATCH 3,025,472

TRANSISTOR AMPLIFIER WITH TEMPERATURE COMPENSATION

Filed Dec. 11, 1956

INVENTOR
WILSON GREATBATCH

BY Roland T. Booth
ATTORNEY

United States Patent Office 3,025,472

Patented Mar. 13, 1962

3,025,472

TRANSISTOR AMPLIFIER WITH TEMPERATURE COMPENSATION

Wilson Greatbatch, Clarence, N.Y., assignor to Taber Instrument Corporation, North Tonawanda, N.Y., a corporation of New York Filed Dec. 11, 1956, Ser. No. 627,594
6 Claims. (Cl. 330—19)

The present invention relates to transistor amplifiers and more particularly to an improved transistor amplifier for power and audio frequencies.

One of the main objects of the invention is to provide a transistor amplifier whose operation is relatively insensitive to environmental temperature changes.

Another important object of this invention is to provide in a transistor amplifier a method of D.C. feedback to stabilize the transistors against operating point shifts due to changes in environmental temperature.

Still another object of the invention is to devise a novel type of amplifier circuit.

The objects of this invention are accomplished briefly in the following manner. The output of a D.C. coupled transistor amplifier is fed back to the input through a frequency selective network which permits a high percentage of D.C. feedback but a much lower percentage of A.C. feedback. The high D.C. loop gain stabilizes the transistor operating points against temperature drift while the A.C. feedback factor sets the A.C. gain of the amplifier and provides improved A.C. gain stability. In this way the invention permits transistor amplifiers to be operated over a much wider temperature range than hitherto possible without the invention.

The foregoing and other objects of the invention will be better understood from the following description of an exemplification thereof, reference being had to the accompanying drawings wherein.

Figure 1:
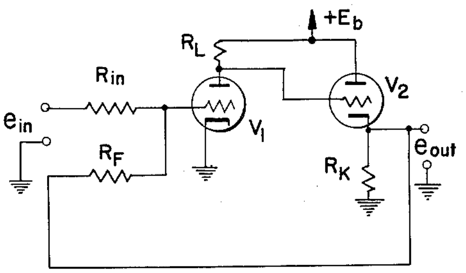
FIG. 1 is a schematic circuit diagram of an amplifier employing two vacuum tube stages.

Transistors present distinct advantages over vacuum-tubes. They are much lighter in weight, consume much less power, are more shock-proof, and are much more reliable than vacuum tubes. They have one severe drawback, however, in that they are very heat sensitive. Changes in environmental temperature tend to cause a drift in the operating point. In a vacuum tube, the operating point remains quite stable with changes in the environmental temperature about the tube. Thus, in designing a vacuum tube amplifier, it is possible to refer to known curves ($i_p$ vs. $e_p$) depicting average plate characteristics which show a family of grid voltage curves for a chosen vacuum tube. A design engineer may draw an appropriate load line and select an operating point which will remain substantially stable despite changes in ambient temperature, as will be readily apparent to those skilled in the art.

In the design of a transistor amplifier, certain similarities to a vacuum tube amplifier have become recognized.

For example, in the grounded-emitter configuration, the collector behaves much like a vacuum tube plate, the emitter behaves much like a vacuum tube cathode, and the base behaves much like a vacuum tube grid. Thus, one may draw a set of collector characteristics which are similar in appearance to the familiar plate characteristics of a pentode vacuum tube. The principal difference is that the grid voltage family of curves is replaced by a base current family since the transistor is inherently a current operated device. Otherwise one may draw load lines, calculate large-signal gain and determine operating points in much the same manner as is done with vacuum tubes.

It has been noted, however, that in practice, the transistor is not as stable against increases in environmental temperature as the vacuum tube, in fact, two rather radical changes take place in the transistor collector characteristics, i.e., the $i_c$ vs. $e_c$ curves. First, the curve for zero values of $i_b$ (base current) shifts upward so that for zero base current, a significant amount of collector current flows, lowering the collector voltage. Secondly, the separation between the curves of the whole family increases markedly, causing all the curves to move upwards. This also causes higher collector currents to flow and moves the operating point along the load line and decreases the collector voltage. This operating point shift causes conventional transistor amplifiers without feedback, to drift into complete cut-off at about 50° C. This fact has plagued the transistor circuit designers for years. Some measures have been developed to partially mediate this difficulty, but the problem has never been satisfactorily solved.

For further material on the temperature induced drift effect in transistor amplifiers, reference may be made to the book: Transistor Audio Amplifiers by R. F. Shea (Wiley, 1955 Ed.), and in particular at pages 96, 157, 163, and 171 thereof.

According to the present invention, operating point stabilization in a transistor amplifier is achieved by the use of direct current (D.C.) feedback. A feedback circuit is provided which senses the D.C. level of the operating point and if such level is too high or too low, an error or difference signal is fed back to the amplifier input in such a manner as to restore the operating point to the desired level. Thus, if the ambient transistor temperature should rise and cause the operating point to shift along the load line in a direction to decrease the collector voltage, then such change would be fed back as a decrease in base current bias would, in turn, decrease the collector current and cause the operating point to shift back down the load line to a point very near its original position.

Referring now to FIG. 1, a two-stage vacuum tube amplifier is shown which will be useful in understanding the principles of operation of the invention. The amplifier utilizes two direct coupled vacuum tube stages and has the further provision of a feedback loop. It should be recognized that since environmental temperature is not generally a problem in vacuum tube amplifier design, such a circuit would not necessarily or generally be utilized to enhance the temperature stability. Tube $V_1$ is a conventional triode amplifier having input terminals $e_{in}$, the input is fed to the triode grid over resistor $R_{in}$, a plate load resistor $R_L$ is provided, and the output thereof is coupled directly to the input of tube $V_2$. The latter tube is connected as a cathode-follower wherein the output voltage $e_{out}$ is developed across a cathode resistor $R_K$. A feedback loop is provided from the output to the grid of tube $V_1$ through the resistor $R_F$. $R_{in}$ and $R_F$ comprise a "summing network" of the type common in analogue computer circuitry. This network produces a signal at the grid of the first tube which is proportional to the sum of the input voltage and the feedback voltage. The summing network is quite conventional in operation.

Any variation in the operating point of the first tube will produce a change in its plate voltage which will be passed through the cathode follower to lower the impedance level, and then be fed back to the input of the first tube through $R_F$. It is seen that an increase in the plate voltage of the first tube will result in an increase in the D.C. output voltage which will be fed back to the input as an increase in D.C. grid voltage. This increase will produce a decrease in plate current of the first tube which will cause the plate voltage to decrease to a point very close to its former value. Thus, any change in the operating point of the first tube will be fed back in such a way as to restore the operating point to its former value.

Figure 2:
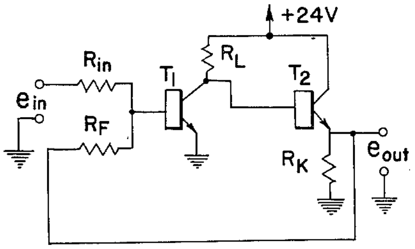
FIG. 2 is a schematic circuit diagram of an amplifier utilizing two transistor stages according to the invention.

Consider now FIG. 2 which is a two stage transistor version of the vacuum tube amplifier of FIG. 1. Transistor $T_1$ is connected in a grounded-emitter configuration, and as such functions in a manner similar to the triode amplifier $V_1$ of FIG. 1. Transistor $T_2$, the base of which is directly coupled to the collector of $T_1$, is connected in a grounded-collector configuration, and, as such, functions in a manner analogous to stage $V_2$ of FIG. 1. Circuit elements in FIG. 2, which correspond to those of FIG. 1 have been identified with identical reference characters. It will be noted that a D.C. feedback voltage, which varies with the direct current output voltage $e_{out}$, is fed back to the base of the first transistor $T_1$ providing a bias current for such first amplifier stage.

Detailed operation of the amplifier circuit of FIG. 2 is as follows:

An input signal $e_{in}$ is applied to the input leg of the summing network which contains the resistance $R_{in}$. The first transistor $T_1$ functions as a high-gain voltage amplifier fed from the summing network, and develops an amplified signal voltage across the collector load resistor $R_L$. This voltage is directly coupled to transistor $T_2$ which acts as an impedance lowering device. $T_2$ develops an output voltage $e_{out}$ across resistor $R_K$ in the emitter leg of the second transistor stage. This output voltage is also applied to the feedback leg of the summing network which consists of the feedback resistance $R_F$.

Any marked increase in environmental temperature of the amplifier of FIG. 2 will cause the operating point of the first transistor $T_1$ to drift up along the load line and decrease the D.C. collector voltage. This decrease will be fed through the grounded-collector "cathode-follower" as a decrease in D.C. output voltage, and will be fed back to the input as a decrease in input base current. This decrease in input base current will decrease the collector current, causing the collector voltage to increase back to a point very close to its former value.

In other words, the direct current level of the output voltage is thus locked at a substantially constant value by the action of the D.C. feedback. If the D.C. level of the output voltage wanders, due to ambient temperature effects on the transistors, the change appears as a change in bias on the first transistor $T_1$ in such a direction as to restore the direct current output voltage level to very close to its former value.

In an amplifier constructed according to the invention of FIG. 2 and successfully tested, the gain variation over an ambient temperature range of −30° C. to +125° C. using silicon transistors was held to ±1%. The same basic amplifier, but without the stabilizing and compensating effect of the D.C. feedback loop drifted into complete cut-off and became totally inoperative above a temperature of approximately +50° C.

Figure 3:
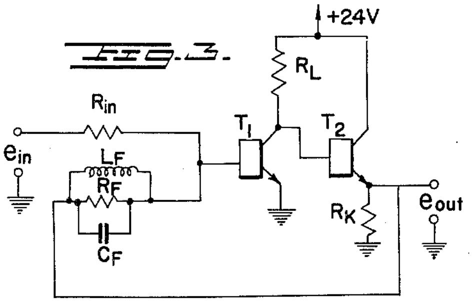
FIG. 3 is a schematic circuit diagram of a modified transistor amplifier of the type shown in FIG. 2.

There is one possible disadvantage in utilizing feedback of the type embodied in the amplifier circuit of FIG. 2, in that alternating current (A.C.), as well as D.C. feedback is present. Therefore, the A.C. gain of the amplifier is also reduced by the feedback. In many cases, one can select a value for $R_F$ which gives enough D.C. feedback and also gives the desired A.C. gain. Such is the case when an A.C. gain of about 10 is desired from FIG. 2. However, if one could keep the D.C. feedback but eliminate the A.C. feedback, an A.C. gain of nearly 200 could be achieved from FIG. 2. Such modification is shown in FIG. 3. Here the feedback leg includes a parallel RLC feedback circuit. Such a circuit has a high impedance to carrier signals, but passes D.C. signals unimpeded through the inductance winding. Thus, a 400 c.p.s. servo amplifier built in this manner could have any A.C. gain up to the full capabilities of the amplifier, but would still have the D.C. feedback necessary to stabilize the operating point. In FIG. 3 the A.C. feedback is set by the value of $R_F$, but the D.C. feedback is nearly 100%, being determined by the D.C. resistance of the inductor winding $L_F$ which is very small at the chosen carrier frequency of 400 c.p.s. in the above example.

It will be apparent that the resonant frequency of the feedback inductance $L_F$ and of the feedback capacitor $C_F$ should be chosen to coincide with the carrier frequency being used. Thus the feedback network of FIG. 3 presents a very low series impedance to D.C. currents, while at the carrier frequency the impedance of the feedback leg of the summing network is approximately that of resistor $R_F$ since the impedance of the parallel combination of $L_F$ and $C_F$ approaches infinity. The net result of the feedback leg of the summing network of FIG. 3 is to provide a large amount of D.C. feedback for operating point stabilization and a lesser amount of A.C. feedback to establish the alternating current gain level of the amplifier.

In an amplifier constructed according to the modified circuit of FIG. 3 and successfully tested, the 1% gain stability was maintained over an increased ambient temperature range of −55° C. to +130° C.

Figure 4:
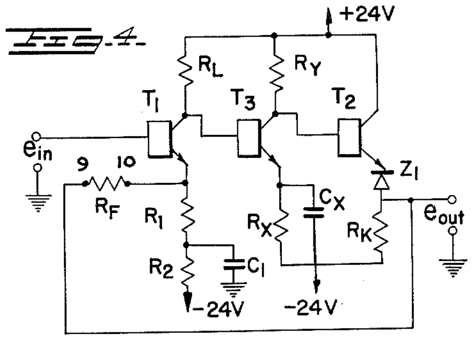
FIG. 4 is a schematic circuit diagram of an improved transistor amplifier which is a modification of that shown in the previous figures.

While the circuit in FIG. 3 gives a great improvement in high temperature operation of transistor amplifiers, a still greater improvement is possible. If still more gain is built into the circuit between the first transistor and the second transistor, the error signal will be amplified more before it is fed back. FIG. 4 shows a method of achieving this. Transistor $T_3$ is connected as a high-gain grounded emitter stage as is $T_1$, but since the input of $T_3$ must be direct-connected to the collector of $T_1$, its base will be at the D.C. potential of the collector $T_1$, about 6 volts in this case to avoid excessive collector currents in $T_3$ the emitter of $T_3$ must be 6 volts positive with respect to ground, but must still be at ground potential, A.C.-wise. Resistor $R_x$ and capacitor $C_x$ accomplish this. The emitter of $T_3$ is held at a point near the base voltage of $T_3$ by the cathode-follower action of the stage, while $C_x$ provides a low impedance path to ground.

Since an additional amplifier stage has been introduced in the circuit of FIG. 4, an additional phase inversion of the input signal will occur, so that the feedback voltage must now be applied in such a manner that it will be negative rather than positive as it was in the case when applied to the base of transistor $T_1$ as in FIGS. 2 and 3. This is effected by connecting the feedback loop to the emitter of $T_1$ as indicated in FIG. 4.

Each amplifier stage in the modification of FIG. 4 is directly coupled to the subsequent stage as in the previous embodiments of the invention. A detailed examination of the amplifier of FIG. 4 reveals the following changes in the circuitry and mode of operation. Excessive collector currents in the intermediate transistor stage $T_3$ are avoided by providing D.C. degeneration by returning the emitter of $T_3$ to a negative voltage supply through resistor $R_x$ and bypassing it with the emitter bypass capacitor $C_x$. This also permits a considerable possible variation in the D.C. level of the voltage at the base of this intermediate transistor without driving it to cutoff.

In FIG. 4 a D.C. feedback path is provided around the complete amplifier through the feedback resistor $R_F$ and two additional resistors $R_1$ and $R_2$. These additional resistors return the emitter of transistor $T_1$ to a negative voltage supply. Again this is provided to permit variations in the D.C. level at the base of $T_1$ without driving it to cutoff. An emitter bypass capacitor $C_1$ effectively grounds the junction of $R_1$ and $R_2$ for A.C. voltages. A further modification in FIG. 4 involves the addition of a suitable Zener diode $Z_1$, in series with the emitter of the output transistor $T_2$. This diode provides a constant voltage drop equal in magnitude to the desired D.C. collector voltage of the intermediate transistor $T_3$. An emitter resistor $R_K$ returned to a negative voltage source furnishes the necessary operating current for Zener diode $Z_1$.

Proper design of the amplifier of FIG. 4 again requires the provision of a large amount of D.C. feedback and a much less degree of A.C. feedback. The overall gain of any feedback amplifier is: (Terman, "Radio Engineer's Handbook," McGraw-Hill, 1943, page 395)

$$\frac{e_{out}}{e_{in}}=\frac{K}{1-K\beta}$$

and for very high values of K (the open loop gain of the amplifier) the overall gain becomes:

$$\frac{e_{out}}{e_{in}}=\frac{K}{-K\beta}=\frac{-1}{\beta}$$

where $\beta$ is the amount of the output signal fed back to the input. In this case $\beta$ is a voltage divider made up of $R_F$, $R_1$, and $R_2$. At D.C. $R_2$ is significant since the capacitor $C_1$ is inactive. At high frequencies, however, the capacitor $C_1$ becomes a short-circuit to ground and removes $R_2$ from the feedback path. The values of $\beta$ for A.C. and D.C. are then:

$$\beta ac=\frac{R_1}{R_F+R_1}\approx 0.01$$

$$\beta dc=\frac{(R_1+R_2)}{R_F+(R_1+R_2)}\approx 0.5$$

Corresponding values of A.C. and D.C. gain are then:

$$\left.\frac{e_{out}}{e_{in}}\right| ac=\frac{-1}{\beta ac}=\frac{-1}{0.01}=-100$$

$$\left.\frac{e_{out}}{e_{in}}\right| dc=\frac{-1}{\beta dc}=\frac{-1}{0.5}=-2$$

Where:

$R_F$=50,000 ohms
$R_1$=500 ohms
$R_2$=50,000 ohms
$C_1$=30 mfd.

Thus, in the amplifier of FIG. 4, a large amount of D.C. feedback is provided to stabilize the operating point, and a lesser amount of A.C. feedback is provided to establish the A.C. closed-loop gain level. Test data for an amplifier constructed according to the circuit modification of FIG. 4 and utilizing germanium transistors showed an improved gain stability of ±0.5% throughout the permissible operating range for such transistors which reaches to +100° C.

A still further improvement is achieved by combining the features of both previous circuits and cascading two circuits of the type seen in FIG. 2, but excluding the summing network and instead, utilizing the feedback system seen in FIG. 4. This results in the circuit shown in FIG. 5. It will be seen that this requires the addition of another grounded-collector (cathode-follower) transistor stage $T_4$ between the two transistors $T_1$ and $T_3$ in FIG. 5. Transistors have an inherently low input impedance and cascading two grounded-emitter stages as in $T_1$ and $T_3$ of FIG. 4 results in a rather severe loading on the first stage, producing a considerable decrease in stage gain. While this is not a serious defect for many applications, still there are some cases where a very high loop gain is desired. In these cases, the addition of the cathode-follower $T_4$, as in FIG. 5, results in nearly double the loop gain of that achieved in FIG. 4. The improvement is due solely to the removal of the undesirable loading of the intermediate transistor $T_3$ on the first transistor $T_1$ in FIG. 4. Naturally, no gain is contributed by the added transistor itself, since it has an inherent stage gain of slightly less than one.

Figure 5:
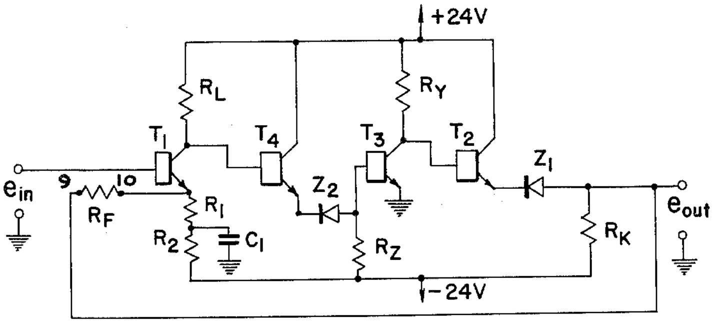
FIG. 5 is a schematic circuit diagram of yet another modification and development of the transistor amplifier of FIGS. 2 through 4.

In the amplifier of FIG. 5 Zener diode $Z_1$ is provided, as before, and an additional Zener diode $Z_2$ is also used. Diodes $Z_1$ and $Z_2$ are used to provide a constant voltage drop between the collector of the previous stage and the base of the following stage, independent of the current passing through the diodes. The use of Zener diodes produces good A.C. and D.C. coupling, while permitting each grounded-emitter transistor stage to operate with the emitter at ground potential.

Figure 6:
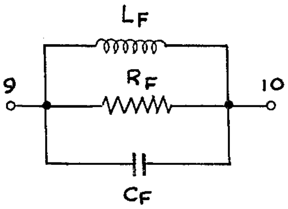
FIG. 6 is a schematic circuit diagram of a network that is used with the amplifiers of FIGS. 4 and 5.

FIGURE 6 shows the RLC network of FIG. 3 with terminals 9 and 10 adapted to be utilized in place of resistor RF alone in the circuits shown in FIGS. 4 and 5. The effect of the RLC circuit in FIGS. 4 and 5 is the same as described previously in connection with FIG. 3.

Although the circuits in FIGURES 2 to 4 inclusive have been shown and described with transistors of the NPN type and the appropriate collector and emitter potentials, the invention operates just as well with transistors of the PNP type. As is apparent to those skilled in the art, changes in the collector and emitter potentials will have to be made if the PNP type of transistor is substituted for the NPN type.

It may be seen from the foregoing that the D.C. feedback of this invention stabilizes the operating points of the individual transistors, thus permitting operation of the transistor amplifier over a wider range of ambient temperatures than that heretofore possible. The improvement is due to a use of D.C. feedback with a new object in mind; that of counteracting the effect of high temperature on the semi-conductor properties of the transistor junction. Such a temperature effect is not present in vacuum tubes and thus compensation of this sort has not been needed in vacuum tube technology. The operation of transistor amplifiers over such widely varying ambient temperatures as those indicated in the test results above, is not possible according to known devices of the prior art without employing the D.C. feedback stabilizing features of the present invention.

What I claim is:

1. An amplifier comprising a series of Class A stages each stage including a transistor having a base, emitter and collector element, said stages having input and output means, the first stage connected in the grounded emitter configuration and having its output means direct coupled to the input means of a second stage of grounded emitter configuration, the output means of said second stage directly connected to the input means of the third stage of grounded collector configuration, a Zener diode connected from the emitter of said third stage to a source of unidirectional potential through a resistor, direct coupled amplifier output means connected between said Zener diode and said resistor, and feedback means consisting of a first feedback resistor connected from said amplifier output means to the emitter of said first stage and a second partially by-passed feedback resistor connected between the emitter of said first stage and a said source of unidirectional potential.

2. The amplifier of claim 1 further including a capacitor and an inductor connected in parallel with said first feedback resistor to provide large amounts of D.C. feedback and preselected amounts of A.C. feedback over a desired frequency range.

3. An amplifier consisting of a series of Class A stages each stage including a transistor having a base, emitter and a collector element, said stages having input and output means, the first stage connected in the common emitter configuration and having its output means directly coupled to the input means of a second stage of grounded collector configuration, the output means of said second stage directly coupled to the input means of a third stage of grounded emitter configuration through a first Zener diode, the output means of said third stage directly coupled to the input means of a fourth stage of grounded collector configuration, a second Zener diode connected from the emitter of said fourth stage to a source of unidirectional potential through a resistor, amplifier output means connected between said second Zener diode and said resistor, and feedback means including a first feedback resistor connected between said amplifier output means and the emitter of said first stage, and a second partially by-passed feedback resistor connected between the emitter of said first stage and said source of unidirectional potential.

4. The amplifier of claim 3 further including a capacitor and an inductor connected in parallel with said first feedback resistor to provide large amounts of D.C. feedback and preselected lesser amounts of A.C. feedback over a desired frequency range.

5. An amplifier consisting of a series of Class A stages each stage including a transistor having a base, emitter and a collector element, said stages having input and output means, the first stage connected in the grounded emitter configuration and having its output means directly coupled to the input means of a second stage of grounded collector configuration, the output means of said second stage directly coupled to the input means of a third stage of grounded emitter configuration, the output means of said third stage directly coupled to the input means of a fourth stage of grounded collector configuration, a Zener diode connected from the emitter of said fourth stage to a source of unidirectional voltage through a resistor, direct-coupled amplifier output means connected between said Zener diode and said resistor, and feedback means including: a resistor connected between said amplifier output means and the emitter of said first stage, and a second partially by-passed feedback resistor connected between the emitter of said first stage and said source of unidirectional voltage.

6. The amplifier of claim 5 further including a capacitor and an inductor connected in parallel with said first feedback resistor.

References Cited in the file of this patent

UNITED STATES PATENTS

| | | |
|---|---|---|
| Re. 23,563 | Barney | Oct. 14, 1952 |
| 2,256,072 | Bruck | Sept. 16, 1941 |
| 2,595,496 | Webster | May 6, 1952 |
| 2,629,785 | Tooker | Feb. 24, 1953 |
| 2,691,074 | Eberhard | Oct. 5, 1954 |
| 2,714,702 | Shockley | Aug. 2, 1955 |
| 2,761,916 | Barton | Sept. 4, 1956 |
| 2,761,917 | Aronson | Sept. 4, 1956 |
| 2,784,262 | Crow | Mar. 5, 1957 |
| 2,789,164 | Stanley | Apr. 16, 1957 |
| 2,801,298 | Mital | July 30, 1957 |

FOREIGN PATENTS

| | | |
|---|---|---|
| 679,424 | Great Britain | Sept. 17, 1952 |
| 201,972 | Australia | May 31, 1956 |

OTHER REFERENCES

Braunbeck: "High-Gain Transistor Audio Amplifier," Radio Electronics, June 1956, pages 30, 31.